(12) United States Patent
Tomita et al.

(10) Patent No.: US 11,264,589 B2
(45) Date of Patent: Mar. 1, 2022

(54) IMAGE DISPLAY DEVICE SEALING MATERIAL AND IMAGE DISPLAY DEVICE SEALING SHEET

(71) Applicant: MITSUI CHEMICALS, INC., Tokyo (JP)

(72) Inventors: Yusuke Tomita, Kisarazu (JP); Masatoshi Takagi, Yokohama (JP); Yugo Yamamoto, Chiba (JP)

(73) Assignee: MITSUI CHEMICALS, INC., Tokyo (JP)

( * ) Notice: Subject to any disclaimer, the term of this patent is extended or adjusted under 35 U.S.C. 154(b) by 152 days.

(21) Appl. No.: 16/615,157

(22) PCT Filed: Jun. 19, 2018

(86) PCT No.: PCT/JP2018/023327
§ 371 (c)(1),
(2) Date: Nov. 20, 2019

(87) PCT Pub. No.: WO2018/235824
PCT Pub. Date: Dec. 27, 2018

(65) Prior Publication Data
US 2020/0176706 A1 Jun. 4, 2020

(30) Foreign Application Priority Data
Jun. 23, 2017 (JP) .............................. JP2017-123586

(51) Int. Cl.
*H01L 47/00* (2006.01)
*H01L 51/52* (2006.01)
(Continued)

(52) U.S. Cl.
CPC .......... *H01L 51/5246* (2013.01); *C08G 59/20* (2013.01); *C08G 59/4284* (2013.01);
(Continued)

(58) Field of Classification Search
CPC ..... H01L 51/5246; H01L 23/29; H01L 23/31; H01L 51/56; C08G 59/20; C08G 59/4284; C08L 25/04; C08L 63/00; G09F 9/00
See application file for complete search history.

(56) References Cited

U.S. PATENT DOCUMENTS

2013/0153880 A1 6/2013 Yamamoto et al.
2013/0161080 A1 6/2013 Lin
(Continued)

FOREIGN PATENT DOCUMENTS

JP 2007046035 A 2/2007
JP 2013057001 A 3/2013
(Continued)

OTHER PUBLICATIONS

International Preliminary Report on Patentability and an English translation thereof (Forms PCT/IB/373, and PCT/ISA/237) dated Jan. 2, 2020, by the International Bureau of WIPO in corresponding International Patent Application PCT/JP2018/023327 (14 pages).
(Continued)

*Primary Examiner* — Victor A Mandala
*Assistant Examiner* — Colleen E Snow
(74) *Attorney, Agent, or Firm* — Buchanan Ingersoll & Rooney PC

(57) ABSTRACT

The image display device sealing material contains a resin component and a curing agent, wherein the resin component contains biphenyl skeleton-containing epoxy resin having a weight-average molecular weight of 200 or more and 100,000 or less, alicyclic skeleton-containing epoxy resin having a weight-average molecular weight of 180 or more and 790 or less, and styrene oligomer having a weight-average molecular weight of 750 or more and 4000 or less.

8 Claims, 3 Drawing Sheets

(51) Int. Cl.
　　　*C08G 59/20*　　(2006.01)
　　　*C08G 59/42*　　(2006.01)
　　　*C08L 25/04*　　(2006.01)
　　　*C08L 63/00*　　(2006.01)
　　　*G09F 9/00*　　(2006.01)
　　　*H01L 23/29*　　(2006.01)
　　　*H01L 23/31*　　(2006.01)
　　　*H01L 51/56*　　(2006.01)

(52) U.S. Cl.
　　　CPC ............... *C08L 25/04* (2013.01); *C08L 63/00* (2013.01); *G09F 9/00* (2013.01); *H01L 23/29* (2013.01); *H01L 23/31* (2013.01); *H01L 51/56* (2013.01)

(56) References Cited

U.S. PATENT DOCUMENTS

| | | |
|---|---|---|
| 2016/0005995 A1 | 1/2016 | Kim et al. |
| 2017/0198135 A1 | 7/2017 | Li et al. |
| 2017/0253013 A1 | 9/2017 | Li et al. |
| 2018/0171188 A1* | 6/2018 | Bae ..................... H01L 51/004 |

FOREIGN PATENT DOCUMENTS

| | | |
|---|---|---|
| JP | 2013166941 A | 8/2013 |
| JP | 2013166949 A | 8/2013 |
| JP | 2015189959 A | 11/2015 |
| WO | 2008111640 A1 | 9/2008 |
| WO | 2010119706 A1 | 10/2010 |
| WO | 2015140900 A1 | 9/2015 |
| WO | 2016074288 A1 | 5/2016 |
| WO | 2016074290 A1 | 5/2016 |

OTHER PUBLICATIONS

International Search Report (PCT/ISA/210) dated Aug. 28, 2018, by the Japanese Patent Office as the International Searching Authority for International Application No. PCT/JP2018/023327.

Written Opinion (PCT/ISA/237) dated Aug. 28, 2018, by the Japanese Patent Office as the International Searching Authority for International Application No. PCT/JP2018/023327.

* cited by examiner

図5

IMAGE DISPLAY DEVICE SEALING MATERIAL AND IMAGE DISPLAY DEVICE SEALING SHEET

TECHNICAL FIELD

The present invention relates to an image display device sealing material and an image display device sealing sheet.

BACKGROUND ART

For an image display device including an optical element, for example, a liquid crystal display and an organic EL display have been known. In such an image display device, the optical element is sealed with a sealing member to suppress deterioration of the optical element by moisture in the atmosphere.

The sealing member is formed, for example, by embedding an optical element in a sealing composition, and then curing the sealing composition. Thus, to give required characteristics appropriate for the use of the sealing member, a composition for the sealing composition has been variously examined.

For example, Patent Document 1 has proposed a sealing composition containing bisphenol epoxy resin having a weight-average molecular weight of $3 \times 10^3$ to $1 \times 10^4$, phenol epoxy resin having a weight-average molecular weight of 200 to 800, a curing accelerator, and a silane coupling agent.

CITATION LIST

Patent Document

Patent Document 1 WO2010/119706

SUMMARY OF THE INVENTION

Problem to be Solved by the Invention

However, when the sealing member formed from the sealing composition described in Patent Document 1 is used in, for example, a touch panel of organic EL displays, because of a high permittivity, noises caused by the sealing member may cause malfunctioning of the touch panel. Furthermore, in such use, the sealing member has to be transparent.

The present invention provides an image display device sealing material that allows for formation of a sealing member having a relatively low permittivity, and ensured transparency; and an image display device sealing sheet.

Means for Solving the Problem

The present invention [1] includes an image display device sealing material comprising a resin component and a curing agent, wherein the resin component contains biphenyl skeleton-containing epoxy resin having a weight-average molecular weight of 200 or more and 100,000 or less, alicyclic skeleton-containing epoxy resin having a weight-average molecular weight of 180 or more and 790 or less, and styrene oligomer having a weight-average molecular weight of 750 or more and 4000 or less.

The present invention [2] includes the image display device sealing material described in [1] above, wherein the resin component has a styrene oligomer content of 5 mass % or more and 25 mass % or less.

The present invention [3] includes the image display device sealing material described in [1] or [2] above, wherein the styrene oligomer includes a homopolymer of a styrene skeleton-containing monomer.

The present invention [4] includes the image display device sealing material described in any one of the above-described [1] to [3], wherein the resin component further contains aliphatic hydrocarbon resin.

The present invention [5] includes the image display device sealing material described in [4] above, wherein the aliphatic hydrocarbon resin content relative to the styrene oligomer is 0.30 or more and 4.0 or less.

The present invention [6] includes the image display device sealing material described in [4] or [5] above, wherein the resin component has an aliphatic hydrocarbon resin content of 20 mass % or less, and a total of the styrene oligomer content and the aliphatic hydrocarbon resin content is 30 mass % or less.

The present invention [7] includes an image display device sealing sheet including a sealing layer composed of the image display device sealing material described in any one of the above-described [1] to [6].

The present invention [8] includes the image display device sealing sheet described in [7] above, wherein the image display device is an organic EL display.

Effects of the Invention

In the image display device sealing material and image display device sealing sheet of the present invention, the resin component contains biphenyl skeleton-containing epoxy resin and styrene oligomer, and therefore a sealing member with a relatively low permittivity and reliable transparency can be formed.

DESCRIPTION OF THE EMBODIMENTS

<Image Display Device Sealing Material>

Figure 1:
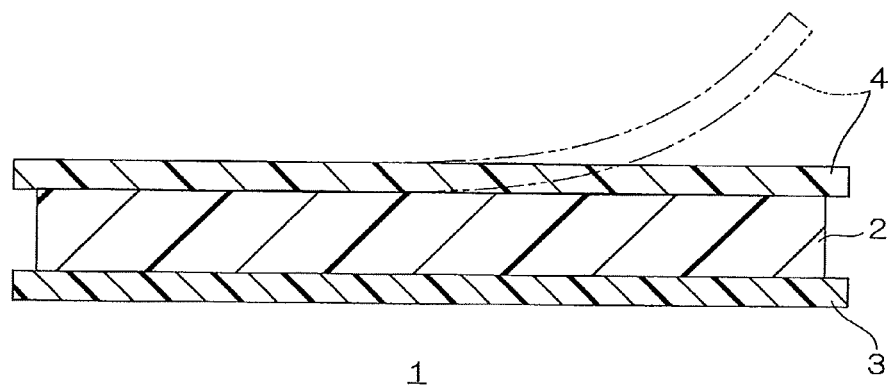
FIG. 1 is a side cross sectional view of a sealing sheet as an embodiment of the image display device sealing sheet of the present invention.

The image display device sealing material of the present invention (hereinafter referred to as sealing material) is a sealing resin composition (image display device sealing resin composition) for sealing an optical element included in the image display device to be described later, and is a curable resin composition that forms a sealing member to be described later by being cured. The sealing material contains a resin component and a curing agent.

(1) Resin Component

The resin component contains, as essential components, biphenyl skeleton-containing epoxy resin having a weight-average molecular weight ($M_w$) of 200 or more and 100,000 or less, alicyclic skeleton-containing epoxy resin having a weight-average molecular weight ($M_w$) of 180 or more and 790 or less, and styrene oligomer having a weight-average molecular weight ($M_w$) of 750 or more and 4000 or less.

(1-1) Biphenyl Skeleton-Containing Epoxy Resin

The biphenyl skeleton-containing epoxy resin is a high molecular weight ($M_w$: 200 or more 100,000 or less) epoxy resin having a biphenyl skeleton and epoxy group. The biphenyl skeleton-containing epoxy resin is solid under normal temperature. The "solid under normal temperature" means that it is in a solid state having no flowability under normal temperature (23° C.), and the "liquid under normal temperature" means that it is in a liquid state having flowability under normal temperature (23° C.) (the same applies in the following).

The biphenyl skeleton-containing epoxy resin has a weight-average molecular weight ($M_w$) of 200 or more, preferably 250 or more, more preferably 800 or more, even more preferably 900 or more, and 100,000 or less, preferably 90,000 or less. The weight-average molecular weight ($M_w$) can be determined by gel permeation chromatography (GPC) using polystyrene as standard substance (the same applies in the following).

The biphenyl skeleton-containing epoxy resin has an epoxy equivalent of, for example, 100 g/eq. or more, preferably 150 g/eq. or more, and for example, 20,000 g/eq. or less, preferably 16,000 g/eq. or less.

Such biphenyl skeleton-containing epoxy resin has, for example, a plurality of biphenyl skeletons and a plurality of epoxy groups (polyfunctional (including bifunctional) epoxy resin), and preferably has a molecular chain including a plurality of biphenyl skeletons and an epoxy group bonded to both terminals of the molecular chain (bifunctional epoxy resin).

For the biphenyl skeleton-containing epoxy resin, for example, biphenyl phenoxy resin represented by formula (1) below is used.

Formula (1)

[Chemica Formula 1]

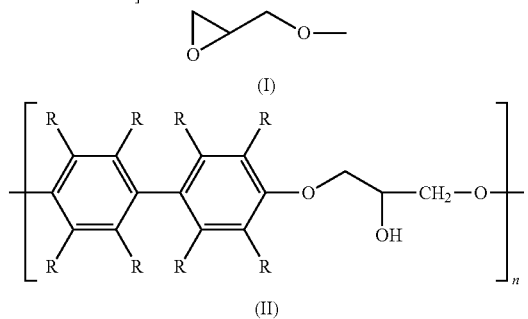

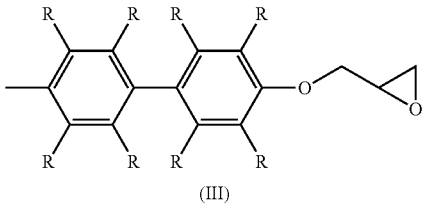

[in formula (1), I, II, and III each represents a constituent unit, and each of I and III represents a terminal unit, and II represents a repeating unit. R represents a hydrogen atom or an alkyl group having 1 to 6 carbon atoms. n represents an integer of 1 or more.] The biphenyl skeleton-containing epoxy resin preferably includes biphenyl phenoxy resin having constituent units I to III represented by the above-described formula (1), even more preferably, biphenyl phenoxy resin having constituent units I to III represented by the above-described formula (1) is used singly.

When the biphenyl skeleton-containing epoxy resin contains biphenyl phenoxy resin having constituent units I to III represented by the above-described formula (1), decrease in moisture permeability of the sealing member (described later) can be achieved.

The biphenyl phenoxy resin having constituent units I to III represented by the above-described formula (1) is a copolymer of a dihydroxy biphenyl derivative and epichlorohydrin, and has a molecular chain including a plurality of biphenyl skeletons, and a glycidyl ether unit bonded to both terminals of the molecular chain.

Examples of the alkyl group represented by R in the above-described formula (1) include a straight chain alkyl group having 1 to 6 carbon atoms (for example, methyl, ethyl, propyl, butyl, pentyl, hexyl) and branched alkyl group having 3 to 6 carbon atoms (for example, isopropyl, isobutyl, tert-butyl, etc.).

Of these examples of R in the above-described formula (1), preferably, hydrogen atom and methyl group are used. The plurality of Rs in the formula (1) can be the same or different.

For the biphenyl phenoxy resin represented by the above-described formula (1), for example, epoxy resin composed of product (copolymer) of epichlorohydrin and 4,4'-biphenol, and epoxy resin composed of product (copolymer) of epichlorohydrin and 4,4'-(3,3'-5,5'-tetra methyl) biphenol are used. The biphenyl phenoxy resin can be used singly or can be used in combination of two or more.

The biphenyl phenoxy resin represented by the above-described formula (1) can include another constituent unit in addition to the constituent units I to III. Examples of another constituent unit include a polyol unit derived from polyol with two or more hydroxy groups (for example, glycol, benzene diol, etc.), and bisphenol unit derived from bisphenol (for example, 4,4'-(1-phenyl ethylidene) bisphenol, 4,4'-(1-phenyl propylidene) bisphenol, etc.).

Of these examples of another constituent unit, preferably, bisphenol unit is used, and more preferably unit derived from 4,4'-(1-phenyl ethylidene) bisphenol is used.

Of these biphenyl phenoxy resin, preferably, epoxy resin composed of product (copolymer) of 4,4'-(3,3'-5,5'-tetra methyl) biphenol, epichlorohydrin, and bisphenol is used.

The biphenyl phenoxy resin represented by the above-described formula (1) has a weight-average molecular weight ($M_w$) of, for example, 1,000 or more, preferably 2,000 or more, and for example, 100,000 or less, preferably 90,000 or less. The biphenyl phenoxy resin represented by the above-described formula (1) has an epoxy equivalent of, for example, 500 g/eq. or more, preferably 1,000 g/eq. or more, and for example, 20,000 g/eq. or less, preferably 16,000 g/eq. or less.

For the biphenyl phenoxy resin represented by the above-described formula (1), a commercially available product can be used. For the commercially available product of the biphenyl phenoxy resin represented by the above-described formula (1), for example, YX6954BH30 (manufactured by Mitsubishi Chemical Corporation., epoxy equivalent 10,000 to 16,000 g/eq.) is used.

For the biphenyl skeleton-containing epoxy resin, in addition to the above-described biphenyl phenoxy resin, for example, biphenyl skeleton-containing epoxy resin having the constituent units I and III and having no constituent unit II represented by the above-described formula (1) (that is, epoxy resin with n=0) is used.

For the biphenyl skeleton-containing epoxy resin having constituent units I and III and having no constituent unit II represented by the above-described formula (1), for example, 4,4'-bis(2,3-epoxy propoxy) biphenyl and 4,4'-bis(2,3-epoxy propoxy)-3,3'-5,5'-tetra methyl biphenyl are used.

The biphenyl skeleton-containing epoxy resin having constituent units I and III and having no constituent unit II represented by the above-described formula (1) (n=0) can further include another constituent unit other than the above-described ones as long as the constituent units I and II are included as main components.

The biphenyl skeleton-containing epoxy resin having constituent units I and III and having no constituent unit II represented by the above-described formula (1) (n=0) has a weight-average molecular weight ($M_w$) of 200 or more, preferably 250 or more, and for example, 2000 or less, preferably 1000 or less, more preferably less than 1000, even more preferably 800 or less. The biphenyl skeleton-containing epoxy resin having constituent units I and III and having no constituent unit II represented by the above-described formula (1) (n=0) has an epoxy equivalent of, for example, 100 g/eq. or more, preferably 125 g/eq. or more, and for example, 1000 g/eq. or less, preferably 500 g/eq. or less, more preferably less than 500 g/eq., particularly preferably 300 g/eq. or less.

For the biphenyl skeleton-containing epoxy resin having constituent units I and III and having no constituent unit II represented by the above-described formula (1) (n=0), a commercially available product can be used. For the commercially available product of the biphenyl skeleton-containing epoxy resin having constituent units I and III and having no constituent unit II represented by the above-described formula (1) (n=0), for example, YX4000 (manufactured by Mitsubishi Chemical Corporation., epoxy equivalent 180 to 192 g/eq.), YX4000H (manufactured by Mitsubishi Chemical Corporation., epoxy equivalent 187 to 197 g/eq.), and YL6121H (manufactured by Mitsubishi Chemical Corporation., epoxy equivalent 170 to 180 g/eq.) are used.

The resin component has a biphenyl skeleton-containing epoxy resin content of, for example, 5 mass % or more, preferably 10 mass % or more, and for example, 50 mass % or less, preferably 40 mass % or less.

(1-2) Alicyclic Skeleton-Containing Epoxy Resin

The alicyclic skeleton-containing epoxy resin is a low molecular-weight ($M_w$: 180 or more and 790 or less) epoxy resin having at least an epoxy group and an aliphatic ring (alicyclic skeleton). The alicyclic skeleton-containing epoxy resin is liquid under normal temperature. The alicyclic skeleton-containing epoxy resin has no biphenyl skeleton.

The alicyclic skeleton-containing epoxy resin has a weight-average molecular weight of 180 or more, and 790 or less, preferably 500 or less. The alicyclic skeleton-containing epoxy resin has an epoxy equivalent of, for example, 90 g/eq. or more, preferably 100 g/eq. or more, and for example, 190 g/eq. or less, preferably 200 g/eq. or less.

The alicyclic skeleton-containing epoxy resin has, for example, a plurality of aliphatic ring and a plurality of epoxy groups (polyfunctional (including bifunctional) epoxy resin).

For the alicyclic skeleton-containing epoxy resin, for example, an epoxy group-containing alicyclic skeleton epoxy resin having an epoxy group composed of two adjacent carbon atoms forming the aliphatic ring and one oxygen atom bonded to these two carbon atoms (bifunctional epoxy resin), and glycidyl ether-containing alicyclic skeleton epoxy resin having a plurality of glycidyl ether units bonded to aliphatic ring (polyfunctional epoxy resin) are used. The alicyclic skeleton-containing epoxy resin can be used singly or in combination.

The resin component contains the alicyclic skeleton-containing epoxy resin, and therefore compared with the case where the resin component contains aromatic ring skeleton-containing epoxy resin, the haze value of the sealing member (described later) can be decreased, and transparency of the sealing member (described later) can be improved.

For the epoxy group-containing alicyclic epoxy resin, for example, an alicyclic epoxy compound having a cycloalkene oxide structure is used.

For the alicyclic epoxy compound having a cycloalkene oxide structure, for example, an epoxy compound having an epoxy cyclohexane structure represented by the formula (2) below (in the following, referred to as ECH structure-containing epoxy compound) and a modified product thereof is used.

Formula (2)

[Chemica Formula 2]

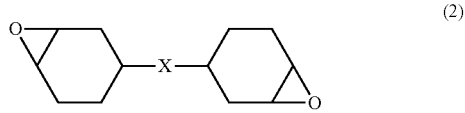

(2)

[in formula (2), X represents a single bond or linking group (divalent group having 1 or more atoms). For the carbon atom composing the cyclohexane ring, a substituent such as an alkyl group can be bonded.]

The ECH structure-containing epoxy compound represented by the above-described formula (2) has an epoxy cyclohexane structure (epoxy cyclohexyl group) at both terminals of the molecule, and the two epoxy cyclohexyl groups are directly bonded by single bond, or bonded through a linking group. The epoxy cyclohexyl group is a functional group including an epoxy group composed of a cyclohexane ring, two adjacent carbon atoms forming the cyclohexane ring, and one oxygen atom bonded to these two carbon atoms.

When X is a single bond in the above-described formula (2), the carbon atom forming the cyclohexane ring of the epoxy cyclohexyl group positioned at one terminal is directly bonded to the carbon atom forming the cyclohexane ring of the epoxy cyclohexyl group positioned at the other terminal.

For the linking group represented by X in the above-described formula (2), for example, a divalent hydrocarbon group, carbonyl group, ether group, thioether group, ester group, carbonate group, amide group, and a group in which these are linked are used.

For the divalent hydrocarbon group, for example, a straight or branched chain alkylene group having 1 to 18 carbon atoms (for example, methylene group, methyl methylene group, dimethyl methylene group, ethylene group, propylene group, trimethylene group, etc.), cycloalkylene group (for example, 1,2-cyclo pentylene group, 1,3-cyclo pentylene group, 1,2-cyclohexylene group, 1,3-cyclohexylene group, 1,4-cyclohexylene group, etc.), and cycloalkylidene group (for example, cyclopentylidene group, cyclohexylidene group, etc.) are used.

Of the linking group represented by X in the above-described formula (2), in view of adhesiveness of the sealing member (described later), preferably, a linking group including oxygen atom is used, even more preferably, a carbonyl group, ether group, ester group, and carbonate group are used, particularly preferably, the ester group is used.

For the alkyl group that can be bonded to the carbon atom as a constituent of the cyclohexane ring, for example, the alkyl group of R in the above-described formula (1) is used. To the carbon atom as a constituent of the cyclohexane ring, preferably, a hydrogen atom is bonded without bonding of the substituent (unsubstituted).

For the ECH structure-containing epoxy compound represented by the above-described formula (2), for example, (3,3',4,4'-diepoxy) bicyclohexyl, bis(3,4-epoxy cyclohexyl methyl) ether, 1,2-bis(3,4-epoxy cyclohexane-1-yl) ethane, 1,2-epoxy-1,2-bis(3,4-epoxy cyclohexane-1-yl) ethane, 2,2-bis(3,4-epoxy cyclohexane-1-yl) propane, 3,4-epoxy cyclohexyl methyl (3,4-epoxy) cyclohexane carboxylate, and ε-caprolactone modified 3',4'-epoxy cyclohexyl methyl 3,4-epoxy cyclohexane carboxylate are used.

For the ECH structure-containing epoxy compound represented by the above-described formula (2), a commercially available product can be used. For the commercially available product of the ECH structure-containing epoxy compound represented by the above-described formula (2), for example, CELLOXIDE 8000, CELLOXIDE 2021P (epoxy equivalent 128 to 145 g/eq.), and CELLOXIDE 2081 (all trade name, manufactured by Daicel Corporation.) are used.

For the glycidyl ether-containing alicyclic skeleton epoxy resin, dicyclopentadiene epoxy resin represented by formula (3) below (in the following, referred to as DCPD epoxy resin) is used.

Formula (3)

[Chemical Formula 3]

(3)

[in formula (3), a substituent such as an alkyl group can be bonded to carbon atom as a constituent of aliphatic ring derived from dicyclopentadiene.]

The DCPD epoxy resin represented by the above-described formula (3) has an aliphatic ring derived from dicyclopentadiene, and two glycidyl ether units bonded to the aliphatic ring.

For the alkyl group that can be bonded to the carbon atom as a constituent of aliphatic ring derived from dicyclopentadiene, for example, the alkyl group of R in the above-described formula (1) is used. For the carbon atom as a constituent of aliphatic ring derived from dicyclopentadiene, preferably, a hydrogen atom is bonded and no substituent is bonded (unsubstituted).

For the DCPD epoxy resin represented by the above-described formula (3), a commercially available product can be used. For the commercially available product of the DCPD epoxy resin represented by the above-described formula (3), for example, EP-4088S (manufactured by ADEKA, epoxy equivalent 170 g/eq.) is used.

The alicyclic skeleton-containing epoxy resin can be used singly or can be used in combination of two or more, and preferably used singly. That is, for the alicyclic skeleton-containing epoxy resin, preferably, one of the ECH structure-containing epoxy compound represented by the above-described formula (2) and the DCPD epoxy resin represented by the above-described formula (3) is used singly.

When the ECH structure-containing epoxy compound represented by the above-described formula (2) is used singly for the alicyclic skeleton-containing epoxy resin, compared with the case where the DCPD epoxy resin represented by the above-described formula (3) is used singly for the alicyclic skeleton-containing epoxy resin, curing speed of the sealing material can be improved.

The resin component has an alicyclic skeleton-containing epoxy resin content of, for example, 10 mass % or more, preferably 20 mass % or more, and for example, 50 mass % or less, preferably 40 mass % or less.

When the alicyclic skeleton-containing epoxy resin content is within the above-described range, the haze value of the sealing member (described later) can be decreased.

(1-3) Styrene Oligomer

The styrene oligomer is a polymer in which the vinyl groups of the plurality of styrene skeletons are bonded to each other, and has a plurality of styrene units derived from a plurality of styrene skeletons. The styrene oligomer is solid under normal temperature.

The styrene oligomer does not include a high molecular weight styrene-butadiene-styrene block copolymer (SBS rubber) with a weight-average molecular weight ($M_w$) of more than 10,000 such as the one shown in Comparative Example 4 to be described later.

The styrene oligomer has a weight-average molecular weight ($M_w$) of 750 or more, preferably 900 or more, and 4000 or less, preferably 3800 or less. The styrene oligomer has a number average molecular weight ($M_n$) of, for example, 500 or more, preferably 600 or more, more preferably 700 or more, and for example, 2500 or less, preferably 2000 or less, even more preferably 1500 or less.

The weight-average molecular weight/number average molecular weight ($M_w/M_n$) is, for example, 1.1 or more, preferably 1.2 or more, more preferably 1.3 or more, and for example, 2.5 or less, preferably 2.0 or less, more preferably 1.9 or less.

For the styrene oligomer, for example, a homopolymer of styrene skeleton-containing monomer, and a copolymer of the styrene skeleton-containing monomer and another polymerizable monomer are used. Such a styrene oligomer can be used singly, or can be used in combination of two or more.

For the styrene skeleton-containing monomer, for example, styrene, α-methyl styrene, vinyl toluene, and isopropenyl toluene are used, preferably, isopropenyl toluene is used. The styrene skeleton-containing monomer can be used singly or can be used in combination of two or more.

Another polymerizable monomer is a monomer that is polymerizable with the styrene skeleton-containing monomer, and has, for example, an ethylenic unsaturated double bond. Examples of another polymerizable monomer include an unsaturated aliphatic monomer having 2 to 10 carbon atoms (for example, ethylene, propylene, butene, isobutene, butadiene, pentene, pentadiene, isoprene, hexadiene, methylbutene, etc.), unsaturated alicyclic monomer having 5 to 20 carbon atoms (for example, cyclopentadiene, dicyclopentadiene, etc.), α,β-unsaturated carboxylic acid (for example, acrylic acid, methacrylic acid, etc.), (meth)acrylate, and $C_5$ fraction produced by refining or decomposing petroleum. The $C_5$ fraction is a fraction generally having a boiling point range under normal pressure of −15° C. to +45° C., and examples thereof include 1-pentene, 2-methyl-1-butene, 3-methyl-1-butene, 2-pentene, isoprene, 1,3-penta diene, and cyclopentadiene. Another polymerizable monomer can be used singly or can be used in combination of two or more.

In the copolymer of the styrene skeleton-containing monomer and another polymerizable monomer, the constituent unit derived from the styrene skeleton-containing monomer is contained by, for example, 50 mass % or more, preferably 80 mass % or more, and for example, 99 mass % or less, preferably 95 mass % or less.

Of the styrene oligomers, preferably, a homopolymer of styrene skeleton-containing monomer is used. That is, the styrene oligomer preferably contains the homopolymer of styrene skeleton-containing monomer, even more preferably, the homopolymer of styrene skeleton-containing monomer is used singly.

When the styrene oligomer contains the homopolymer of styrene skeleton-containing monomer (particularly, when the homopolymer of styrene skeleton-containing monomer is used singly), moisture permeability of the sealing member (described later) can be decreased.

The resin component has a styrene oligomer content of, for example, 1 mass % or more, preferably 5 mass % or more, and for example, 40 mass % or less, preferably 25 mass % or less, more preferably 20 mass % or less, particularly preferably 18 mass % or less.

When the styrene oligomer content is within the above-described range, while decreasing permittivity of the sealing member (described later), haze value of the sealing member (described later) can be decreased.

(1-4) Optional Resin Component Such as Aliphatic Hydrocarbon Resin

The resin component contains, as an optional component, preferably, aliphatic hydrocarbon resin. When the resin component contains aliphatic hydrocarbon resin, the haze value of the sealing member (described later) can be reliably decreased, and transparency of the sealing member (described later) can be reliably improved.

The aliphatic hydrocarbon resin is petroleum hydrocarbon resin mainly composed of dicyclopentadiene extracted from $C_5$ fraction produced from naphtha decomposition. Aliphatic hydrocarbon resin has an aliphatic ring derived from dicyclopentadiene, and has no epoxy group. Aliphatic hydrocarbon resin is flaky solid under normal temperature.

The aliphatic hydrocarbon resin has a weight-average molecular weight ($M_w$) of, for example, 400 or more, preferably 500 or more, and for example, 1500 or less, preferably 1000 or less.

The aliphatic hydrocarbon resin has a softening point of, for example, 80° C. or more and 120° C. or less. The softening point can be measured in accordance with the method described in JIS K2207.

The aliphatic hydrocarbon resin has a bromine number of, for example, 70 g/100 g or more and 90 g/100 g or less. The softening point can be measured in accordance with the method described in JIS K2543.

For the aliphatic hydrocarbon resin, for example, a homopolymer of dicyclopentadiene (hereinafter referred to as unmodified alicyclic resin), and ester-modified alicyclic resin in which ester group is introduced into unmodified alicyclic resin are used. The aliphatic hydrocarbon resin can be used singly or can be used in combination of two or more.

Of the aliphatic hydrocarbon resin, in view of compatibility, preferably, ester-modified alicyclic resin is used. The aliphatic hydrocarbon resin preferably includes aliphatic hydrocarbon resin, even more preferably, ester-modified alicyclic resin, and particularly preferably, ester-modified alicyclic resin is used singly.

The ester-modified alicyclic resin has a saponification value of, for example, 100 mgKOH/g or more and 200 mgKOH/g. The saponification value can be measured in accordance with the method described in JIS K0070.

For the ester-modified alicyclic resin, a commercially available product can be used. For the commercially available product of the ester-modified alicyclic resin, for example, Quintone 1500 (manufactured by ZEON CORPORATION), and Quintone 1525L (manufactured by ZEON CORPORATION) are used.

The resin component has an aliphatic hydrocarbon resin content of, for example, 1 mass % or more, preferably 5 mass % or more, and for example, 30 mass % or less, preferably 20 mass % or less.

In the resin component, a total of the styrene oligomer content and the aliphatic hydrocarbon resin content is, for example, 2 mass % or more, preferably 10 mass % or more, and for example, 40 mass % or less, preferably 30 mass % or less.

When the aliphatic hydrocarbon resin content is the above-described lower limit or more, and a total of the styrene oligomer content and the aliphatic hydrocarbon resin content is the above-described lower limit or more, in the sealing member (described later), permittivity can be reliably decreased, and high transparency can be reliably secured. When the aliphatic hydrocarbon resin content is the above-described upper limit or less, and the total of the styrene oligomer content and the aliphatic hydrocarbon resin content is the above-described upper limit or less, formability of the sealing material can be suitably adjusted, and the sealing material can be stably formed into a sheet.

Relative to the styrene oligomer, the aliphatic hydrocarbon resin content (mass ratio) is, for example, 0.2 or more, preferably 0.30 or more, and for example, 5.0 or less, preferably 4.0 or less.

When the aliphatic hydrocarbon resin content relative to the styrene oligomer is the above-described lower limit or more, haze value of the sealing member (described later) can be reliably decreased, and transparency of the sealing member (described later) can be reliably improved. When the aliphatic hydrocarbon resin content relative to the styrene oligomer is the above-described upper limit or less, in the sealing member (described later), while reliably decreasing permittivity, high transparency can be ensured stably even more.

The resin component can further contain, as an optional component, bisphenol skeleton-containing epoxy resin having a weight-average molecular weight of 800 or more and 100,000 or less.

The bisphenol skeleton-containing epoxy resin has a plurality of bisphenol skeletons and a plurality of epoxy groups (polyfunctional (including bifunctional) epoxy resin), and is solid under normal temperature. The bisphenol skeleton-containing epoxy resin does not include the biphenyl skeleton, and has a higher molecular weight than that of the above-described alicyclic skeleton-containing epoxy resin.

To be specific, bisphenol skeleton-containing epoxy resin has a weight-average molecular weight ($M_w$) of, 800 or more, preferably 900 or more, 100,000 or less, preferably 90,000 or less.

The bisphenol skeleton-containing epoxy resin has an epoxy equivalent of, for example, 100 g/eq. or more, preferably 150 g/eq. or more, and for example, 20,000 g/eq. or less, preferably 15,000 g/eq. or less.

The bisphenol skeleton-containing epoxy resin is a copolymer of, for example, bisphenol and epichlorohydrin, and has a molecular chain including a plurality of bisphenol skeletons, and a glycidyl ether unit bonded to both terminals of the molecular chain (bifunctional epoxy resin). Examples of bisphenol include bisphenol A, and bisphenol F, and preferably, bisphenol F is used.

The bisphenol skeleton-containing epoxy resin is contained so as to adjust the content in the resin component for formability of the sealing member (described later). In Examples to be described later, when the content of another resin component is changed, the bisphenol skeleton-containing epoxy resin content is adjusted so that a total of the resin component is 100 parts by mass (that is, bisphenol skeleton-containing epoxy resin content=100–a total of another resin component content).

To be specific, the resin component has a bisphenol skeleton-containing epoxy resin content of, for example, 5 mass % or more, preferably 15 mass % or more, and for example, 40 mass % or less, preferably 30 mass % or less. When the bisphenol skeleton-containing epoxy resin content is within the above-described range, formability of the sealing member (described later) is improved.

To the extent that does not hinder the effects of the invention, the resin component can contain another resin component excluding the above-described specific resin component (biphenyl skeleton-containing epoxy resin, alicyclic skeleton-containing epoxy resin, styrene oligomer, aliphatic hydrocarbon resin, bisphenol skeleton-containing epoxy resin).

Examples of the another resin component include another epoxy resin (for example, bisphenol skeleton-containing epoxy resin with a weight-average molecular weight of less than 800, etc.), polyolefin (for example, polyethylene, poly butadiene, etc.), polychloroprene, polyamide, polyamide-imide, polyurethane, polyether, polyester, and silicone resin. These examples of another resin component may be used singly, or may be used in a combination of two or more. The resin component contains another resin component of, for example, 10 mass % or less, preferably 5 mass % or less.

(2) Curing Agent

The curing agent allows the resin component to polymerize and cure the sealing material. The curing agent is not particularly limited as long as the sealing material can be cured. Examples of the curing agent include an amine curing agent (for example, diethylene triamine, triethylene tetramine, tri(dimethyl amino methyl) phenol, etc.), imidazole curing agent (for example, 2-methyl imidazole, 2-ethyl-4-methyl imidazole, etc.), acid anhydride curing agent (for example, phthalic anhydride, trimellitic anhydride, pyromellitic dianhydride, etc.), and heat cationic curing agent. These curing agents can be used singly or can be used in combination of two or more.

Of these curing agents, preferably, a heat cationic curing agent is used. That is, the curing agent preferably include a heat cationic curing agent, and preferably, the heat cationic curing agent is used singly. When the curing agent contains the heat cationic curing agent, the speed of curing of the sealing material can be improved.

The heat cationic curing agent is a heat-acid generating agent that generates acid by heating. The heat cationic curing agent generates cation by heating, and is not particularly limited as long as it is a compound that can start the polymerization of the above (1-1) biphenyl skeleton-containing epoxy resin and (1-2) alicyclic skeleton-containing epoxy resin, and preferably a compound that is capable of starting polymerization under 120° C. or less, i.e., a heat-resistant temperature of display devices (for example, organic EL element, etc.). Examples of the heat cationic curing agent include known cationic polymerization initiators. For the heat cationic polymerization initiator, for example, sulfonium salt, phosphonium salt, quaternary ammonium salt, diazonium salts, and iodonium salts whose counter anions are $AsF_6^-$, $SbF_6^-$, $PF_6^-$, $BF_4^-$, $B(C_6F_5)_4^-$, and $CF_3SO_3^-$ are used.

Examples of the sulfonium salt include boron fluoride sulfonium salt (for example, triphenyl sulfonium boron tetrafluoride, etc.), arsenic fluoride sulfonium salt (for example, triphenyl sulfonium arsenic hexafluoride, tri(4-methoxy phenyl) sulfonium arsenic hexafluoride, diphenyl (4-phenyl thiophenyl) sulfonium arsenic hexafluoride, etc.), antimony fluoride sulfonium salt (for example, triphenyl sulfonium antimony hexafluoride, etc.), and phosphorus fluoride sulfonium salt (for example, triphenyl sulfonium phosphate hexafluoride, etc.).

For the phosphonium salt, for example, antimony fluoride phosphonium salt (for example, ethyl triphenyl phosphonium antimony hexafluoride, tetra butyl phosphonium antimony hexafluoride, etc.) is used.

Examples of the quaternary ammonium salt include antimony fluoride quaternary ammonium salt (for example, N,N-dimethyl-N-benzyl anilinium antimony hexafluoride, N,N-dimethyl-N-benzyl pyridinium antimony hexafluoride, N,N-dimethyl-N-(4-methoxy benzyl) pyridinium antimony hexafluoride, N,N-diethyl-N-(4-methoxy benzyl) pyridinium antimony hexafluoride, N,N-diethyl-N-(4-methoxy benzyl) toluidinium antimony hexafluoride, N,N-dimethyl-N-(4-methoxy benzyl) toluidinium antimony hexafluoride, etc.), boron fluoride quaternary ammonium salt (for example, N,N-diethyl-N-benzyl anilinium boron tetrafluoride, etc.), and organic acid quaternary ammonium salt (for example, N,N-diethyl-N-benzyl pyridinium trifluoro methane sulfonic acid, etc.).

Examples of the iodonium salt include antimony fluoride iodonium salt (for example, diphenyl iodonium antimony hexafluoride, etc.), phosphorus fluoride iodonium salt (for example, diphenyl iodonium phosphate hexafluoride, etc.), and boron fluoride iodonium salt (for example, diphenyl iodonium boron tetrafluoride, etc.).

These heat cationic curing agents can be used singly or can be used in combination of two or more.

Of the heat cationic curing agents, preferably, quaternary ammonium salt is used, even more preferably, antimony fluoride quaternary ammonium salt is used.

For the heat cationic curing agent, a commercially available product can be used. For the commercially available product of the heat cationic curing agent, for example, CXC-1612, CXC-1733, CXC1821 (all manufactured by King Industries, Inc.), SAN AID SI-60, SAN AID SI-80, SAN AID SI-B3, SAN AID SI-B3A, SAN AID SI-B4 (all manufactured by SANSHIN CHEMICAL INDUSTRY CO., LTD.), and TA-100 (manufactured by San-Apro Ltd.) are used.

The curing agent content relative to 100 parts by mass of the resin component is, for example, 0.5 parts by mass or more, preferably 1 part by mass or more, and for example, 10 parts by mass or less, preferably 5 parts by mass or less.

(3) Another Additive

The sealing material can contain, as necessary, an organic solvent, silane coupling agent, and leveling agent as another additives.

When the sealing material contains an organic solvent, the sealing material can be prepared as a varnish. The organic solvent is not particularly limited as long as the resin component and the curing agent can be homogenously dispersed or dissolved. Examples of the organic solvent include aromatic hydrocarbons (for example, benzene, toluene, xylene, etc.), ketones (for example, acetone, methyl ethyl ketone, methyl isobutyl ketone, etc.), ethers (for example, dibutyl ether, tetrahydrofuran, dioxane, ethylene glycol monoalkyl ether, ethylene glycol dialkylether, 1-methoxy-2-propanol, etc.), esters (for example, ethyl acetate, butyl acetate, etc.), and nitrogen-containing compounds (for example, N-methylpyrrolidone, dimethyl imidazolidinone, dimethyl formaldehyde, etc.). These organic solvents can be used singly, or can be used in combination of two or more.

Of these organic solvents, preferably, ketones are used, even more preferably, methyl ethyl ketone is used. When the organic solvent contains ketones, the resin component (particularly, biphenyl skeleton-containing epoxy resin) can be dissolved homogenously.

The organic solvent content relative to 100 parts by mass of the resin component is, for example, 50 parts by mass or more, preferably 60 parts by mass or more, and for example, 90 parts by mass or less, preferably 80 parts by mass or less.

When the sealing material contains the silane coupling agent, adherence of the sealing member (described later) to the board (described later) can be improved.

Examples of the silane coupling agent include an epoxy group-containing silane coupling agent (for example, γ-glycidoxy propyl trimethoxysilane, γ-glycidoxy propyltriethoxy silane, β-(3,4-epoxy cyclohexyl) ethyl trimethoxysilane, etc.), amino group-containing silane coupling agent (for example, N-2-(amino ethyl)-3-amino propylmethyl dimethoxy silane, N-2-(amino ethyl)-3-amino propyl methyltrimethoxysilane, N-2-(amino ethyl)-3-amino propyl methyl triethoxy silane, 3-amino propyl trimethoxysilane, etc.), and methacryloyl group-containing silane coupling agent (for example, γ-methacryloxy propylmethyl dimethoxy silane, γ-methacryloxy propyl trimethoxysilane, etc.). These silane coupling agents can be used singly or can be used in combination of two or more.

Of these silane coupling agents, preferably, an epoxy group-containing silane coupling agent is used, even more preferably, γ-glycidoxy propyl trimethoxysilane is used.

The silane coupling agent content relative to 100 parts by mass of the resin component is, for example, 0.05 parts by mass or more, preferably 0.1 parts by mass or more, and for example, 30 parts by mass or less, preferably 5 parts by mass or less.

When the sealing material contains the leveling agent, the surface of the sealing material can be made smooth when the sealing material is applied. The leveling agent content relative to 100 parts by mass of the resin component is, for example, 0.01 parts by mass or more, preferably 0.1 parts by mass or more, and for example, 5.0 parts by mass or less, preferably 1.0 part by mass or less.

The sealing material can further contain, as necessary, as another additive, a filler, polymerization initiator auxiliaries, antioxidant, wettability improver, surfactant, plasticizer, ultraviolet absorber, antiseptic agent, and antibacterial agent at a suitable ratio.

<Image Display Device Sealing Sheet>

The above-described sealing material can be distributed as is singly, and is an industrially applicable product, but in view of handleability, preferably, it is distributed as an image display device sealing sheet.

With reference to FIG. 1, a sealing sheet 1 as an embodiment of the image display device sealing sheet of the present invention is described.

As shown in FIG. 1, the sealing sheet 1 includes a sealing layer 2 composed of the above-described sealing material, a base film 3, and a release film 4. The sealing sheet 1 is a component for producing an image display device, and do not include a display element and a board that mounts the display element. To be specific, the sealing sheet 1 consists of the sealing layer 2, base film 3, and release film 4, distributed as a single component, and is an industrially applicable device.

To prevent contamination on the sealing layer 2, when the sealing sheet 1 is stored, the sealing layer 2 is preferably protected with the base film 3 and the release film 4. When the sealing sheet 1 is used, the base film 3 and release film 4 are removed.

The sealing layer 2 is a dried product of the above-described sealing material, and has a film shape (flat plate shape). To be specific, the sealing layer 2 has a predetermined thickness, extends in a predetermined direction orthogonal to the thickness direction, and has a flat front face and flat rear face.

In the sealing layer 2, the above-described epoxy component (biphenyl skeleton-containing epoxy resin, alicyclic skeleton-containing epoxy resin, bisphenol skeleton-containing epoxy resin) is not reacted, and the sealing layer 2 contains these epoxy components in uncured state.

The sealing layer 2 has a thickness of, for example, 1 μm or more, preferably 5 μm or more, and for example, 100 μm or less, preferably 30 μm or less.

The base film 3 is releasably attached to the rear face of the sealing layer 2 to support and protect the sealing layer 2 before the sealing sheet 1 is used for the formation of the sealing member (described later). That is, the base film 3 is a flexible film that can be laminated to the rear face of the sealing layer 2 so as to cover the rear face of the sealing layer 2 at the time of shipping, transporting, and storing of the sealing sheet 1, and can be peeled off to be bent substantially U-shape from the rear face of the sealing layer 2 right before the use of the sealing sheet 1.

The base film 3 has a flat plate shape. To be specific, it has a predetermined thickness, extend into a predetermined direction orthogonal to the thickness direction, and has a flat front face and flat rear face. The bonding face (front face) of the base film 3 is release treated, as necessary.

Examples of the material for the base film 3 include resin materials such as polyester (for example, polyethylene terephthalate (PET), etc.), and polyolefin (for example, polyethylene, polypropylene, etc.), and preferably, polyethylene terephthalate is used.

Of these examples of the base film 3, preferably, a film having moisture barrier or gas barrier properties is used, even more preferably, a film composed of polyethylene terephthalate is used. The thickness of the base film 3 is suitably selected in accordance with the material of the film, and in view of conformability to an object of the sealing material such as display device, for example, the thickness is about 25 µm to 150 µm.

The release film 4 is attached to the front face of the sealing layer 2 to protect the sealing layer 2 before the sealing sheet 1 is used for the formation of the sealing member (described later). That is, the release film 4 is a flexible film that can be laminated to the front face of the sealing layer 2 so as to cover the front face of the sealing layer 2 at the time of shipping, transporting, and storing of the sealing sheet 1, and can be peeled off to be bent substantially U-shape from the front face of the sealing layer 2 right before the use of the sealing sheet 1.

The release film 4 has a flat plate shape. To be specific, it has a predetermined thickness, extend into a predetermined direction orthogonal to the thickness direction, and has a flat front face and flat rear face. The surface of the bonding face (rear face) of the release film 4 is release treated, as necessary. For the material of the release film 4, those resin materials given as examples for the material for the base film 3 are used. The thickness of the release film 4 is suitably selected in accordance with the material of the film, and in view of conformability to an object of the sealing material such as display device, for example, the thickness is about 25 µm to 150 µm.

<Method for Producing Image Display Device Sealing Sheet>

Next, description is given below of the method for producing the sealing sheet 1.

To produce sealing sheet 1, for example, the above-described sealing material (preferably, varnish containing organic solvent) is prepared, and the sealing material is applied to the surface of the base film 3 by a known method.

The sealing material is prepared by mixing the above-described resin component, curing agent, and additive (preferably, the above-described organic solvent) at the above-described ratio. The components can be mixed by, for example, dispersing with a ball mill, mixing in a flask, and kneading with a tri-roll.

The sealing material can be applied by a method such as, for example, screen printing, dispenser, and application roll.

Then, the sealing material is dried, and as necessary by volatilizing the organic solvent, a film is formed.

The heating temperature is a temperature that allows the sealing material to dry but not be cured, and for example, 20° C. or more, preferably 90° C. or more, and for example, 120° C. or less, preferably less than 100° C. The heating time is, for example, 1 minute or more, preferably 2 minutes or more, and for example, 30 minutes or less, preferably 15 minutes or less.

In this manner, the film is dried, and the sealing layer 2 prepared from the sealing material is prepared. Then, the release film 4 is attached to the surface of the sealing layer 2.

The sealing sheet 1 is produced in this manner.

<Production of Image Display Device>

Then, with reference to FIG. 2, FIG. 3A to FIG. 3C, and FIG. 4, a method for producing a touch sensor-provided organic EL display (in the following, referred to as organic EL display 10) as an embodiment of the method for producing an image display device is described.

In this embodiment, a touch sensor-provided organic EL display is used as the image display device, however, the image display device is not particularly limited. Examples of the image display device include a liquid crystal display (touch sensor-provided liquid crystal display) and an organic EL display (touch sensor-provided organic EL display). Of these examples of the image display device, preferably, an organic EL display, even more preferably, a touch sensor-provided organic EL display, particularly preferably, a capacitive touch sensor-provided organic EL display is used. That is, the sealing material is preferably a sealing material for an organic EL display, even more preferably, a sealing material for a touch sensor-provided organic EL display, and the sealing sheet is preferably a sealing sheet for an organic EL display, even more preferably, a sealing sheet for a touch sensor-provided organic EL display.

Figure 2:
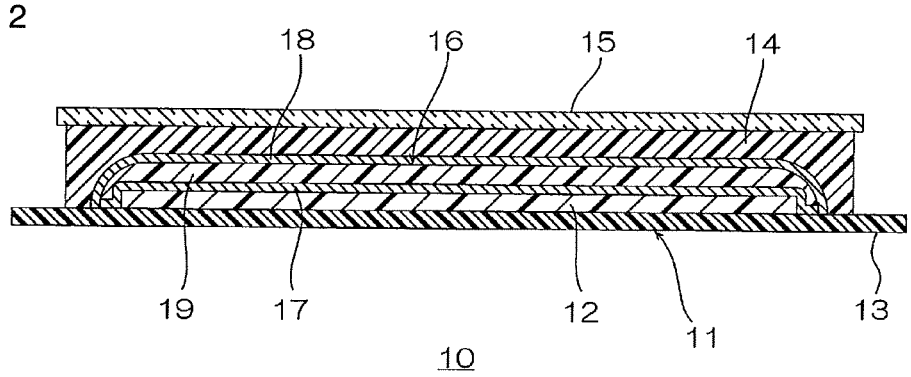
FIG. 2 is a side cross sectional view of a touch sensor-provided organic EL display as an embodiment of an image display device (embodiment having an in-cell structure or on-cell structure) including a sealing member formed from the sealing layer shown in FIG. 1.
Figure 3A:
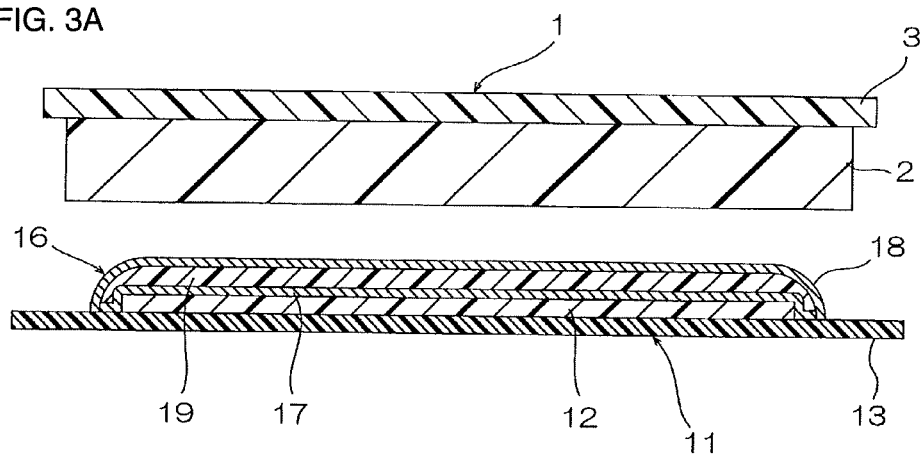
FIG. 3A illustrates an embodiment (embodiment in which the sealing layer on the base film is bonded to the board) of the method for producing the touch sensor-provided organic EL display as shown in FIG. 2, showing a step of preparing a element-mounting unit.
Figure 3B:
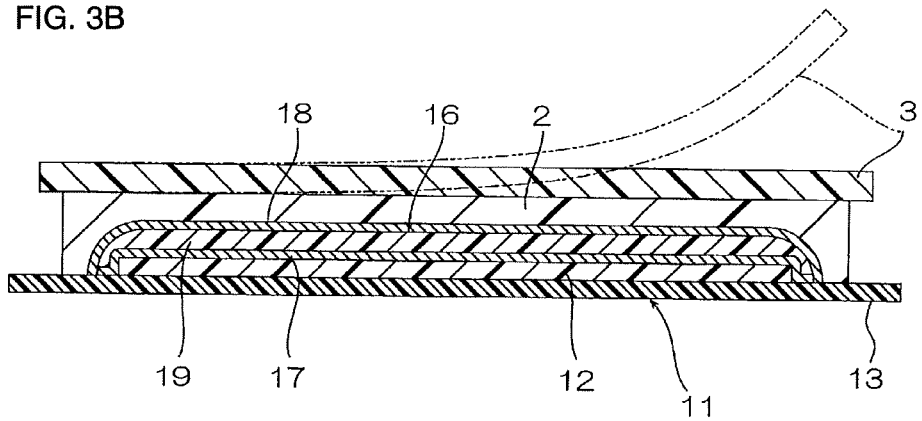
FIG. 3B shows, following FIG. 3A, a step of bonding the sealing layer to the board so that the organic EL element is embedded in the sealing layer.
Figure 3C:
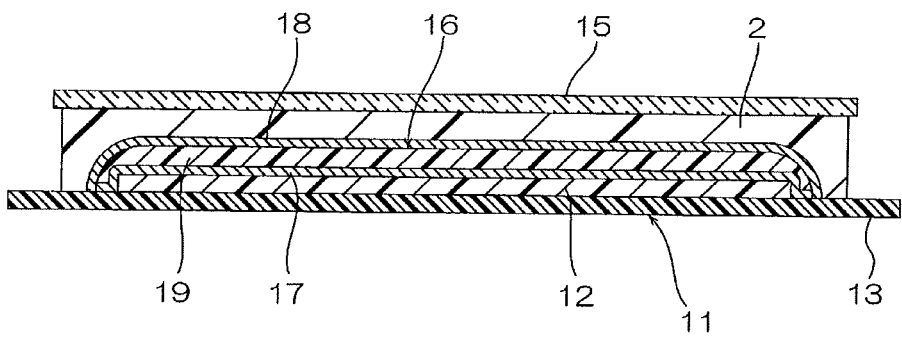
FIG. 3C shows, following FIG. 3B, a step of removing the release film from the sealing layer, and bonding a cover glass to the sealing layer.

The method for producing an organic EL display 10 includes a step of preparing an element-mounting unit 11 (ref: FIG. 3A), a step of bonding the sealing layer 2 of the sealing sheet 1 to the board 13 so as to embed the organic EL element 12 covered with the barrier layer 16 (ref: FIG. 3B), a step of bonding a cover glass or barrier film 15 to the sealing layer 2 (ref: FIG. 3C), and a step of forming the sealing member 14 by curing the sealing layer 2 (ref: FIG. 2).

In the method for producing the organic EL display 10, first, as shown in FIG. 3A, the element-mounting unit 11 is prepared. The element-mounting unit 11 includes a board 13, organic EL element 12 as an example of the optical element (display element), barrier layer 16, and electrode (not shown).

The board 13 supports the organic EL element 12. The board 13 preferably has flexibility.

The organic EL element 12 is a known organic EL element, and is mounted on the board 13. The organic EL element 12 includes, although not shown, a cathode reflective electrode, organic EL layer, and transparent anode electrode.

The barrier layer 16 covers the organic EL element 12, and suppresses the moisture in the atmosphere to make contact with the organic EL element 12. The barrier layer 16 includes a first inorganic barrier layer 17, flat layer 19, and second inorganic barrier layer 18.

The first inorganic barrier layer 17 is disposed at the upper face and the side face of the organic EL element 12 so as to surround the organic EL element 12. For the material of the first inorganic barrier layer 17, for example, metal oxide (for example, aluminum oxide, silicon oxide, copper oxide, etc.) and metal nitride (for example, aluminum nitride, silicon nitride, etc.) are used. These materials of the first inorganic barrier layer 17 can be used singly or can be used in combination of two or more. Of these materials of the first inorganic barrier layer 17, preferably, metal nitride, even more preferably, silicon nitride is used.

The flat layer 19 is disposed at the upper face of the first inorganic barrier layer 17. For the material of the flat layer 19, a known resin material is used.

The second inorganic barrier layer 18 is disposed at the upper face and the side face of the flat layer 19 so as to surround the flat layer 19. For the material of the second inorganic barrier layer 18, for example, those materials given as examples of the material for the first inorganic barrier layer 17 are used.

The electrodes (not shown) make up the sensor for the touch sensor-provided organic EL display. The electrode (not shown) is positioned between the board 13 and the sealing member 14 (described later). For example, the electrode (not shown) can be positioned in the board 13, or on the organic EL element 12.

Then, as shown with the phantom line in FIG. 1, the release film 4 is peeled from the sealing sheet 1 to remove the release film 4. Then, as shown in FIG. 3B, the sealing sheet 1 is heated to the bonding temperature, and then the sealing layer 2 is bonded to the board 13 so that the sealing layer 2 allows the organic EL element 12 covered with the barrier layer 16 to be embedded.

The bonding temperature is a temperature that does not cure but softens the sealing layer 2, and for example, the temperature is 40° C. or more, preferably 60° C. or more, and for example, 120° C. or less, preferably 100° C. or less.

Then, as shown with the phantom line in FIG. 3B, the base film 3 is peeled from the sealing layer 2 to be removed. Then, as shown in FIG. 3C, a cover glass or barrier film 15 is bonded to the upper face of the sealing layer 2. The cover glass or barrier film 15 has, although not shown, a glass plate, and an electrode provided on the lower face of the glass plate and making up the sensor of the touch sensor-provided organic EL display.

Figure 4:
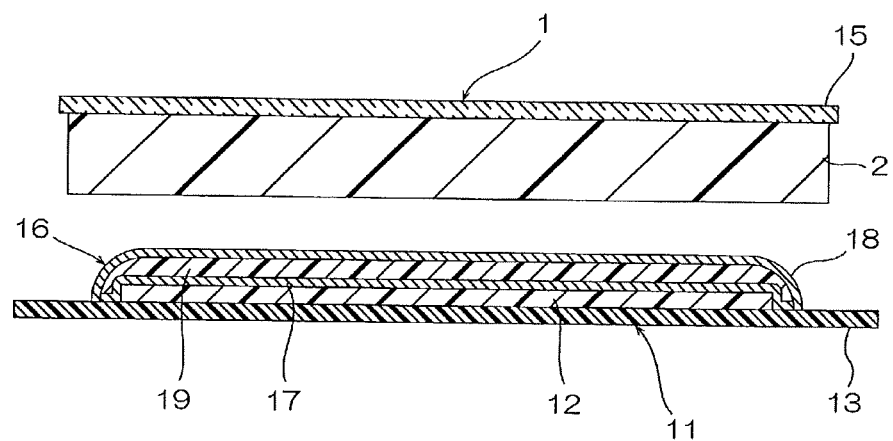
FIG. 4 illustrates another embodiment of the method for producing a touch sensor-provided organic EL display (embodiment in which the sealing layer on the cover glass or barrier film is bonded to the board).

As shown in FIG. 4, after bonding the sealing layer 2 to the cover glass or barrier film 15, the sealing layer 2 can be bonded to the element-mounting unit 11.

As shown in FIG. 2, then, the sealing layer 2 is heated to the curing temperature to cure the sealing layer 2 to form the sealing member 14.

The curing temperature is higher than the above-described drying temperature. The curing temperature is, for example, 70° C. or more, preferably 80° C. or more, and for example, 150° C. or less, preferably 120° C. or less. The curing time is, for example, 10 minutes or more, preferably 30 minutes or more, and for example, 2 hours or less, preferably 60 minutes or less.

The organic EL display 10 including the element-mounting unit 11, sealing member 14, and cover glass or barrier film 15 is produced in the above-described manner. The organic EL display 10 is an electrostatic capacitive touch panel. The organic EL display 10 has an in-cell structure, in which the organic EL element 12 is disposed between the two electrodes that make up the sensor, or an on-cell structure, in which one of the two electrodes that makes up the sensor is disposed on the organic EL element 12.

The sealing member 14 is a cured product of the sealing layer 2 (sealing material), and seals the organic EL element 12 covered with the barrier layer 16.

The sealing member 14 has a permittivity of, for example, 3.0 or more, preferably 3.2 or more, and for example, less than 3.80, preferably 3.70 or less. The permittivity can be measured in accordance with the method described in Examples to be described later.

When the permittivity of the sealing member 14 is the above-described lower limit or more, the materials can be selected even more freely. When the permittivity of the sealing member 14 is the above-described upper limit or less, malfunction of the touch sensor-provided organic EL display can be suppressed.

The sealing member 14 has a haze value of, for example, 0.1% or more, and for example, less than 5.0%, preferably 4.0% or less, more preferably 3.0% or less, particularly preferably 2.0% or less, particularly preferably less than 1.0%. The haze value can be measured in accordance with the method described in Examples to be described later.

When the haze value of the sealing member 14 is the above-described upper limit or less, visibility of the display (including touch sensor-provided organic EL display) can be improved.

The sealing member 14 has a moisture permeability of, for example, 20 $g/m^2 \cdot 24$ h or more, and for example, 50 $g/m^2 \cdot 24$ h or less, preferably less than 45 $g/m^2 \cdot 24$ h, more preferably 40 $g/m^2 \cdot 24$ h or less. The moisture permeability can be measured in accordance with the method described in Examples to be described later.

When the moisture permeability of the sealing member 14 is the above-described upper limit or less, deterioration of the optical element sealed in the sealing member 14 can be suppressed.

<Operations and Effects>

The sealing member of the liquid crystal display is provided like a frame so as to surround, for example, a liquid crystal disposed between the substrate and the glass plate. On the other hand, as shown in FIG. 2, the sealing member of the organic EL display is provided so that the organic EL element is embedded therein. Therefore, the sealing member of the organic EL display has more effects from permittivity than the sealing member of the liquid crystal display, and decrease in permittivity is desired.

Meanwhile, the sealing member of the organic EL display is not required to have a low permittivity as much as the sealing member for a general semiconductor component.

The inventors of the present invention found out that by adding styrene oligomer, which is generally used as the tackifier, to the resin component for the sealing material, the permittivity of the sealing member formed from the sealing material can be adjusted to be within the range required for an image display device, particularly an organic EL display.

However, when styrene oligomer is added to the resin component, there are disadvantages such as the following: the sealing member gets cloudy, transparency of the sealing member is reduced, and high transparency required for the sealing member of image display devices (particularly organic EL display) cannot be secured.

Thus, the inventors of the present invention have examined various compositions of the resin component, found out that with the resin component containing styrene oligomer along with the biphenyl skeleton-containing epoxy resin, while reducing permittivity, high transparency can be secured in the sealing member, thereby completing the present invention.

In the above-described sealing material, the resin component contains biphenyl skeleton-containing epoxy resin and styrene oligomer, and therefore in the sealing member, permittivity can be reduced to the range required for image display devices (particularly organic EL display), and high transparency required for image display devices (particularly organic EL display) can be secured.

The resin component has a styrene oligomer content of, preferably, within the above-described range. Therefore, transparency of the sealing member can be improved.

For the styrene oligomer, preferably, a homopolymer of the styrene skeleton-containing monomer is used singly. Therefore, moisture permeability of the sealing member can be decreased, and deterioration of the display element (for example, organic EL element, etc.) sealed with the sealing member can be suppressed.

The resin component preferably contains aliphatic hydrocarbon resin. Therefore, transparency of the sealing member can be improved even more reliably.

The aliphatic hydrocarbon resin content relative to the styrene oligomer is, preferably, within the above-described range. Therefore, transparency of the sealing member can be improved even more reliably.

The resin component preferably has an aliphatic hydrocarbon resin content of the above-described upper limit or less, and the total of the styrene oligomer content and the aliphatic hydrocarbon resin content is the above-described upper limit or less. Therefore, formability of the sealing material can be suitably adjusted, and the sealing material can be stably formed into a sheet.

As shown in FIG. 1, the sealing sheet 1 has the sealing layer 2 composed of the sealing material. Therefore, handleability of the sealing material can be improved. Furthermore, in the sealing member, while decreasing permittivity, high transparency can be secured.

Modified Example

In the modified example, the members and steps corresponding to the components mentioned in the above embodiment are designated by the same reference numerals, and detailed descriptions thereof are omitted.

As shown in FIG. 1, the sealing sheet 1 includes the sealing layer 2, base film 3, and release film 4, but the image display device sealing sheet of the present invention is not limited thereto. The image display device sealing sheet does not have to include the base film 3 and/or release film 4 as long as it includes the sealing layer 2. That is, the image display device sealing sheet can consist of only the sealing layer 2, or can include the sealing layer 2 and one of the base film 3 and release film 4.

As shown in FIG. 2, the organic EL display 10 includes the barrier layer 16, but it is not limited thereto. The organic EL display 10 does not have to include the barrier layer 16.

The organic EL display 10 has an in-cell structure in which the organic EL element 12 is disposed between two electrodes that make up the sensor, or an on-cell structure in which one of the two electrodes is disposed on the organic EL element 12, but it is not limited thereto.

Figure 5:
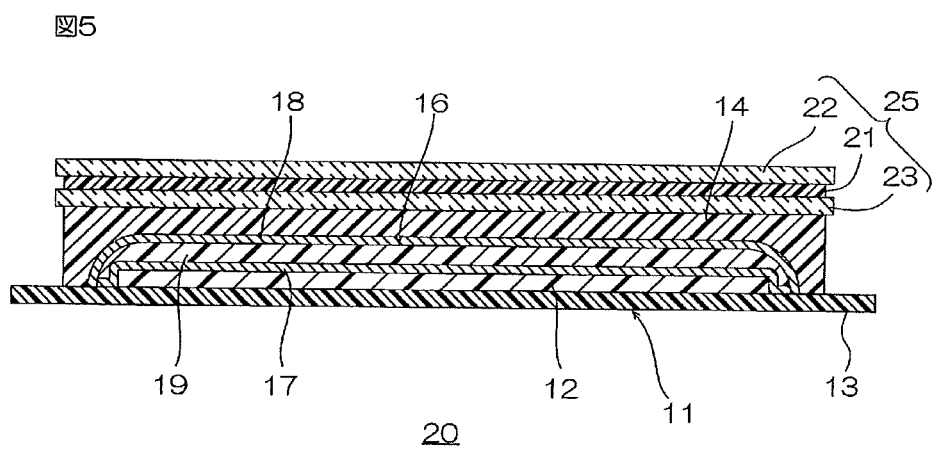
FIG. 5 is a side cross sectional view of a touch sensor-provided organic EL display in another embodiment of the image display device (embodiment of out-cell structure).

As shown in FIG. 5, for example, the organic EL display 20 can have an out-cell structure in which the two electrodes that make up the sensor are disposed at the upper side than the sealing member 14. The organic EL display 20 includes the above-described element-mounting unit 11, the above-described sealing member 14, and a sensor unit 25.

The sensor unit 25 includes a glass board 23, adhesive layer 21, and cover glass 22. The glass board 23 is disposed at the upper face of the sealing member 14. The glass board 23 includes a transparent electrode that makes up the sensor of the touch sensor-provided organic EL display. The adhesive layer 21 is disposed between the glass board 23 and the cover glass 22, and allows the glass board 23 to adhere to the cover glass 22. The cover glass 22 is disposed at the upper side of the adhesive layer 21. The cover glass 22 includes an electrode that makes up the sensor of the touch sensor-provided organic EL display. In the organic EL display 20, the board 13 does not include the electrode.

The above-described modified example also has the same operations and effects of the embodiment described above. The above-described embodiment and modified example can be used in combination.

EXAMPLES

The present invention is further described in detail based on EXAMPLES below. However, the present invention is not limited to Examples. The specific numerical values of mixing ratio (content ratio), physical property value, and parameter used in the following can be replaced with upper limit values (numerical values defined with "or less" or "below") or lower limit values (numerical values defined with "or more" or "above") of corresponding numerical values in mixing ratio (content ratio), physical property value, and parameter described in "DESCRIPTION OF EMBODIMENTS" above. The "parts" and "%" are based on mass unless otherwise specified.

Examples 1 to 3

Biphenyl phenoxy resin (trade name: YX6954BH30, manufactured by Mitsubishi Chemical Corporation., R is hydrogen atom and methyl group in the above-described formula (1), weight-average molecular weight: 39,000, epoxy equivalent: 10,000 to 16,000 g/eq.), bisphenol skeleton-containing epoxy resin (trade name: jER-4005P, manufactured by Mitsubishi Chemical Corporation., weight-average molecular weight: 6,200, epoxy equivalent: 1070 g/eq.), ECH structure-containing epoxy compound (trade name: CELLOXIDE 2021P(CEL2021P), 3,4-epoxy cyclohexyl methyl (3,4-epoxy) cyclohexane carboxylate, molecular weight: 252.3, epoxy equivalent: 128 to 145 g/eq.), homopolymer of isopropenyl toluene (IPT) (homopolymer A) (styrene oligomer, weight-average molecular weight: 1200, number average molecular weight: 800), heat cationic initiator (trade name: CXC-1612, manufactured by King Industries), and methyl ethyl ketone (organic solvent) were mixed in accordance with the formulation shown in Table 1, thereby preparing a varnish of a sealing material.

Example 4

A varnish of a sealing material was prepared in the same manner as in Example 1, except that the homopolymer of IPT (homopolymer A) (styrene oligomer) was changed to a copolymer of IPT and $C_5$ fraction (styrene oligomer, weight-average molecular weight: 1600, number average molecular weight: 1100).

Example 5

A varnish of a sealing material was prepared in the same manner as in Example 2, except that the ECH structure-containing epoxy compound was changed to a DCPD epoxy resin (trade name: EP-4088S, manufactured by ADEKA, weight-average molecular weight: 308.2, epoxy equivalent: 170 g/eq.).

Examples 6 to 9

A varnish of a sealing material was prepared in the same manner as in Example 2, except that aliphatic hydrocarbon resin (trade name: Quintone 1500, manufactured by ZEON CORPORATION, weight-average molecular weight: 750) was further added to the varnish of the sealing material, and the homopolymer of IPT (homopolymer A) content was changed as shown in Table 1.

Examples 10 to 12

A varnish of a sealing material was prepared in the same manner as in Example 8, except that the bisphenol skeleton-containing epoxy resin content was changed as shown in Table 1, and the aliphatic hydrocarbon resin content was changed as shown in Table 1.

Example 13

A varnish of a sealing material was prepared in the same manner as in Example 9, except that the ECH structure-containing epoxy compound was changed to a DCPD epoxy resin.

Example 14

A varnish of a sealing material was prepared in the same manner as in Example 8, except that the ECH structure-containing epoxy compound was changed to a DCPD epoxy resin.

Example 15

A varnish of a sealing material was prepared in the same manner as in Example 8, except that the bisphenol skeleton-containing epoxy resin was not used, and the biphenyl phenoxy resin and ECH structure-containing epoxy compound contents were changed as shown in Table 1.

Examples 16 to 18

Biphenyl skeleton-containing epoxy resin (trade name: YX4000H, manufactured by Mitsubishi Chemical Corporation., R is hydrogen atom and methyl group in the above-described formula (1), n=0, weight-average molecular weight: 354.2, epoxy equivalent: 187 to 197 g/eq.), bisphenol skeleton-containing epoxy resin (phenoxy type) (trade name: jER4275, manufactured by Mitsubishi Chemical Corporation., containing bisphenol A skeleton and bisphenol F skeleton, epoxy equivalent: 8,400 to 9,200 g/eq.), ECH structure-containing epoxy compound (trade name: CELLOXIDE 2021P, 3,4-epoxy cyclohexyl methyl (3,4-epoxy) cyclohexane carboxylate, molecular weight: 252.3, epoxy equivalent: 128 to 145 g/eq.), homopolymer of isopropenyl toluene (IPT) (homopolymer A) (styrene oligomer, weight-average molecular weight: 1200, number average molecular weight: 800), heat cationic initiator (trade name: CXC-1612, manufactured by King Industries), and methyl ethyl ketone (organic solvent) were mixed in accordance with the formulation shown in Table 2, thereby preparing a varnish of a sealing material.

Examples 19 to 25

A varnish of a sealing material was prepared in the same manner as in Example 8, except that the biphenyl phenoxy resin content was changed as shown in Table 2, the ECH structure-containing epoxy resin content was changed as shown in Table 2, and the bisphenol skeleton-containing epoxy resin content was changed as shown in Table 2.

Examples 26 to 32

Biphenyl phenoxy resin (trade name: YX6954BH30, manufactured by Mitsubishi Chemical Corporation., R is hydrogen atom and methyl group in the above-described formula (1), weight-average molecular weight: 39,000, epoxy equivalent: 10,000 to 16,000 g/eq.), bisphenol skeleton-containing epoxy resin (phenoxy type) (trade name: jER4275, manufactured by Mitsubishi Chemical Corporation., containing bisphenol A skeleton and bisphenol F skeleton, epoxy equivalent: 8,400 to 9,200 g/eq.), ECH structure-containing epoxy compound (trade name: CELLOXIDE 2021P, 3,4-epoxy cyclohexyl methyl (3,4-epoxy) cyclohexane carboxylate, molecular weight: 252.3, epoxy equivalent: 128 to 145 g/eq.), homopolymer of isopropenyl toluene (IPT) (homopolymer B) (styrene oligomer, weight-average molecular weight: 1420, number average molecular weight: 920), aliphatic hydrocarbon resin (trade name: Quintone 1500, manufactured by ZEON CORPORATION, weight-average molecular weight: 750), heat cationic initiator (trade name: CXC-1612, manufactured by King Industries), and methyl ethyl ketone (organic solvent) were mixed in accordance with the formulation shown in Table 2, thereby preparing a varnish of a sealing material.

Example 33

Biphenyl phenoxy resin (trade name: YX6954BH30, manufactured by Mitsubishi Chemical Corporation., R is hydrogen atom and methyl group in the above-described formula (1), weight-average molecular weight: 39,000, epoxy equivalent: 10,000 to 16,000 g/eq.), bisphenol skeleton-containing epoxy resin (trade name: jER-4005P, manufactured by Mitsubishi Chemical Corporation., weight-average molecular weight: 6,200, epoxy equivalent: 1070 g/eq.), ECH structure-containing epoxy compound (trade name: CELLOXIDE 2021P, 3,4-epoxy cyclohexyl methyl (3,4-epoxy) cyclohexane carboxylate, molecular weight: 252.3, epoxy equivalent: 128 to 145 g/eq.), homopolymer of isopropenyl toluene (IPT) (homopolymer B) (styrene oligomer, weight-average molecular weight: 1420, number average molecular weight: 920), copolymer of styrene and α-methyl styrene (styrene oligomer, weight-average molecular weight: 3240, number average molecular weight: 1900), aliphatic hydrocarbon resin (trade name: Quintone 1500, manufactured by ZEON CORPORATION, weight-average molecular weight: 750), heat cationic initiator (trade name: CXC-1612, manufactured by King Industries), and methyl ethyl ketone (organic solvent) were mixed in accordance with the formulation shown in Table 2, thereby preparing a varnish of a sealing material.

Comparative Example 1

Bisphenol skeleton-containing epoxy resin (phenoxy type) (trade name: jR4275, manufactured by Mitsubishi Chemical Corporation., containing bisphenol A skeleton and bisphenol F skeleton, epoxy equivalent: 8,400 to 9,200 g/eq.), bisphenol skeleton-containing epoxy resin (trade name: JER4005P, manufactured by Mitsubishi Chemical Corporation., epoxy equivalent: 1070 g/eq.), aromatic ring skeleton-containing epoxy resin (trade name: YL-983U, manufactured by Mitsubishi Chemical Corporation., epoxy equivalent: 169 g/eq., weight-average molecular weight: 326.2), heat cationic initiator (trade name: CXC-1612, manufactured by King Industries), and methyl ethyl ketone (organic solvent) were mixed in accordance with the formulation shown in Table 1, thereby preparing a varnish of a sealing material.

Comparative Example 2

A varnish of a sealing material was prepared in the same manner as in Comparative Example 1, except that homopolymer of IPT (homopolymer A) (styrene oligomer) was added to the varnish of the sealing material, the bisphenol skeleton-containing epoxy resin content was changed as shown in Table 1, and the aromatic ring skeleton-containing epoxy resin was changed to the ECH structure-containing epoxy compound.

Comparative Example 3

A varnish of a sealing material was prepared in the same manner as in Comparative Example 1, except that the bisphenol skeleton-containing epoxy resin (phenoxy type) was changed to biphenyl phenoxy resin, and the aromatic ring skeleton-containing epoxy resin was changed to an ECH structure-containing epoxy compound.

Comparative Example 4

A varnish of a sealing material was prepared in the same manner as in Example 2, except that instead of the homopolymer of IPT (styrene oligomer), a styrene-butadiene-styrene block copolymer (SBS resin, trade name: TUFPRENE™ 125, manufactured by Asahi Kasei Corporation., weight-average molecular weight 80,000) was added. With this varnish of the sealing material, the resin component was not dissolved in the organic solvent.

<Evaluation>

Sheet Formability

The varnish of the sealing material of Examples and Comparative Examples was applied with an applicator on a PET film (PET film treated for releasing (trade name: Purex® A53, manufactured by DuPont Teijin Films, thickness: 38 base film), and then in a nitrogen purge oven, it was dried at 90° C. for 3 minutes, thereby forming a sealing layer having a thickness of 15

Then, the sealing layer was bonded to a PET film (PET film treated for releasing (trade name: Purex® A31, manufactured by DuPont Teijin Films, thickness: 38 release film) by a heat laminator at 80° C.

A sealing sheet including a base film, sealing layer, and release film was prepared in the above-described manner. Moldability of the sealing layer was evaluated visually.

In Examples 1 to 11, 13 to 33 and Comparative Examples 1 to 3, the sealing layer was formed into a sheet excellently. Meanwhile, in Example 12, the sealing layer was brittle and the sealing layer was partially chipped.

Permittivity

The sealing sheet was prepared in the same manner as in the evaluation for the above-described sheet formability, two for every Examples and Comparative Examples. Then, in the two sealing sheets for the same Example or Comparative Example, the release film was peeled from the sealing layer, and the two sealing layers were bonded to each other in the thickness direction to give a thickness of 30 μm.

Then, one side of the base film of the two sealing layers bonded to each other was peeled and cured at 100° C. for 1 hour, and then the other side of the base film was peeled from the cured sealing layer, thereby producing a measurement sample. The permittivity of the produced sample at 100 kHz was measured using an LCR meter HP4284A (manufactured by Agilent Technologies Japan, Ltd.) based on auto-balancing bridge method.

Then, permittivity was evaluated based on the following criteria. The results are shown in Tables 1 and 2.
Good: less than 3.80
Bad: 3.80 or more Haze Value A sealing sheet of Examples and Comparative Examples was prepared in the same manner as in the evaluation for the above-described sheet formability. Then, the release film was peeled from the sealing layer, and then the sealing layer was cured at 100° C. for 1 hour. Then, the base film was peeled from the cured sealing layer, thereby producing a measurement sample. The haze value of the produced sample was measured using a haze meter NDH2000 manufactured by Nippon Denshoku Industries Co., Ltd.

The haze value was evaluated based on the following criteria. The results are shown in Tables 1 and 2.
Good: less than 1.0%
Fair: 1.0% or more and less than 5.0%
Bad: 5.0% or more.

Moisture Permeability

A sealing sheet of Example and Comparative Example was prepared in the same manner as in the evaluation for the above-described sheet formability. Then, the release film was peeled from the sealing layer, and then the sealing layer was cured at 100° C. for 1 hour. Then, the base film was peeled from the cured sealing layer, thereby producing a measurement sample. The moisture permeability (moisture permeability amount) of the produced sample was measured in accordance with JIS Z0208 under conditions of 60° C. and 90% RH. Thereafter, based on the film thickness of the sample used for the measurement, conversion was made to a case where the sample thickness was 100 μm.

Then, the moisture permeability was evaluated based on the following criteria. The results are shown in Tables 1 and 2.
Good: less than 45 g/m²·24 h
Fair: 45 g/m²·24 h or more

TABLE 1

| Formulation (unit: parts by mass) | | Trade name | Ex. 1 | Ex. 2 | Ex. 3 | Ex. 4 | Ex. 5 |
|---|---|---|---|---|---|---|---|
| Resin component | Biphenyl skeleton-containing epoxy resin | YX6954BH30 | 20 | 20 | 20 | 20 | 20 |
| | Alicyclic skeleton-containing epoxy resin | CEL2021P | 30 | 30 | 30 | 30 | — |
| | DCPD epoxy resin | EP-4088S | — | — | — | — | 30 |
| | IPT homopolymer A | —(Mw1200) | 20 | 25 | 30 | — | 25 |
| | Copolymer of IPT and C$_5$ fraction | —(Mw1600) | — | — | — | 20 | — |
| Optional resin component | Bisphenol skeleton-containing epoxy resin (phenoxy type) | jER-4275 | — | — | — | — | 25 |
| | Bisphenol skeleton-containing epoxy resin | jER-4005P | 30 | 25 | 20 | 30 | — |
| | Aromatic ring skeleton-containing epoxy resin | YL983U | — | — | — | — | — |
| | Aliphatic hydrocarbon resin | Quintone 1500 | — | — | — | — | — |
| | SBS resin | TUFPRENE™ 125 | — | — | — | — | — |
| Curing agent | Heat cationic initiator | CXC-1612 | 4 | 4 | 4 | 4 | 4 |
| Organic solvent | | Methyl ethyl ketone | 75 | 75 | 75 | 75 | 75 |
| Evaluation | Permittivity@100 kHz | Evaluation [—] | Good 3.77 | Good 3.60 | Good 3.47 | Good 3.75 | Good 3.65 |
| | Haze | Evaluation [%] | Fair 2.20 | Fair 2.60 | Fair 3.64 | Fair 2.10 | Fair 1.30 |
| | Moisture permeability | Evaluation [g/m² · 24 h] | Good 36 | Good 34 | Good 35 | Fair 49 | Good 33 |

| Formulation (unit: Resin component parts by mass) | | Ex. 6 | Ex. 7 | Ex. 8 | Ex. 9 | Ex. 10 | Ex. 11 |
|---|---|---|---|---|---|---|---|
| Biphenyl skeleton-containing epoxy resin | Biphenyl phenoxy resin | 20 | 20 | 20 | 20 | 20 | 20 |
| Alicyclic skeleton-containing epoxy resin | ECH structure-containing epoxy resin | 30 | 30 | 30 | 30 | 30 | 30 |
| | DCPD epoxy resin | — | — | — | — | — | — |
| Styrene oligomer | IPT homopolymer A | 5 | 10 | 15 | 20 | 15 | 15 |
| | Copolymer of IPT and C$_5$ fraction | — | — | — | — | — | — |
| Optional resin component | Bisphenol skeleton-containing epoxy resin (phenoxy type) | — | — | — | — | — | — |

TABLE 1-continued

| Evaluation | | Ex. 12 | Ex. 13 | Ex. 14 | Ex. 15 | Comp. Ex. 1 | Comp. Ex. 2 | Comp. Ex. 3 | Comp. Ex. 4 |
|---|---|---|---|---|---|---|---|---|---|
| | Bisphenol skeleton-containing epoxy resin | 25 | — | — | 25 | 25 | — | 30 | 20 |
| | Aromatic ring skeleton-containing epoxy resin | — | — | — | — | — | 30 | — | — |
| | Aliphatic hydrocarbon resin | 20 | — | — | 15 | 10 | — | 5 | 15 |
| | SBS resin | — | — | — | — | — | 25 | — | — |
| | Heat cationic initiator | 4 | 4 | 4 | 4 | 4 | — | 4 | 4 |
| | Methyl ethyl ketone | 75 | 75 | 75 | 75 | 75 | — | 75 | 75 |
| Curing agent | | | | | | | | | |
| Organic solvent | | | | | | | | | |
| Permittivity@100 kHz | | Good 3.61 | — | — | Good 3.64 | Good 3.67 | Good 3.55 | Good 3.59 | Good 3.56 |
| Haze | | Good 0.30 | — | — | Good 0.52 | Good 0.80 | Fair 3.15 | Good 0.33 | Good 0.62 |
| Moisture permeability | | Good 36 | — | — | Good 41 | Good 34 | Good 35 | Good 38 | Good 34 |

| | | Ex. 12 | Ex. 13 | Ex. 14 | Ex. 15 | Comp. Ex. 1 | Comp. Ex. 2 | Comp. Ex. 3 | Comp. Ex. 4 |
|---|---|---|---|---|---|---|---|---|---|
| Formulation (unit: parts by mass) | | | | | | | | | |
| Resin component | Biphenyl phenoxy resin | 20 | 20 | 20 | 40 | — | — | 20 | 20 |
| | Biphenyl skeleton-containing epoxy resin | | | | | | | | |
| | ECH structure-containing epoxy resin | 30 | — | — | 35 | — | 30 | 30 | 30 |
| | Alicyclic skeleton-containing epoxy resin | | | | | | | | |
| | DCPD epoxy resin | — | 30 | 30 | — | — | — | — | — |
| | IPT homopolymer A | 15 | 20 | 15 | 15 | — | 25 | — | — |
| | Styrene oligomer | | | | | | | | |
| | Copolymer of IPT and C5 fraction | — | — | — | — | 20 | 20 | — | — |
| Optional resin component | Bisphenol skeleton-containing epoxy resin (phenoxy type) | — | — | — | — | — | — | — | — |
| | Bisphenol skeleton-containing epoxy resin | 15 | 25 | 25 | — | 50 | 25 | 50 | 25 |

TABLE 1-continued

|  |  | | | | | | | | | |
|---|---|---|---|---|---|---|---|---|---|---|
| | Aromatic ring skeleton-containing epoxy resin | — | — | — | — | 30 | — | — | — |
| | Aliphatic hydrocarbon resin | 20 | 5 | 10 | 10 | — | — | — | — |
| | SBS resin | — | — | — | — | — | — | — | 25 |
| Curing agent | Heat cationic initiator | 4 | 4 | 4 | 4 | 4 | 4 | 4 | 4 |
| Organic solvent | Methyl ethyl ketone | 75 | 75 | 75 | 75 | 75 | 75 | 75 | 75 |
| Evaluation | Permittivity@100 kHz | Good 3.54 | Good 3.63 | Good 3.67 | Good 3.67 | Bad 4.02 | Good 3.63 | Bad 3.84 | Compatibility NG |
| | Haze | Good 0.80 | Fair 1.00 | Good 0.60 | Fair 1.30 | Good 0.19 | Bad 8.30 | Good 0.20 | |
| | Moisture permeability | Good 33 | Good 33 | Good 31 | Good 41 | Good 35 | Good 40 | Good 42 | |

TABLE 2

| Formulation (unit: parts by mass) | | | Trade name | Ex. 16 | Ex. 17 | Ex. 18 | Ex. 19 | Ex. 20 | Ex. 21 | Ex. 22 | Ex. 23 |
|---|---|---|---|---|---|---|---|---|---|---|---|
| Resin component | Biphenyl skeleton-containing epoxy resin | Biphenyl phenoxy resin | YX6954BH30 | — | — | — | 20 | 25 | 30 | 25 | 25 |
| | | Biphenyl skeleton-containing epoxy resin | YX4000H | 20 | 20 | 20 | — | — | — | — | — |
| | Alicyclic skeleton-containing epoxy resin | ECH structure-containing epoxy resin | CEL2021P | 30 | 25 | 20 | 20 | 25 | 20 | 15 | 20 |
| | Styrene oligomer | IPT homopolymer A | —(Mw1200) | 15 | 15 | 15 | 15 | 15 | 15 | 15 | 15 |
| | | IPT homopolymer B | —(Mw1420) | — | — | — | — | — | — | — | — |
| | | Copolymer of styrene and α-styrene | —(Mw3240) | — | — | — | — | — | — | — | — |
| | Optional resin component | Bisphenol skeleton-containing epoxy resin (phenoxy type) | jER-4275 | 25 | 30 | 35 | — | — | — | 35 | — |
| | | Bisphenol skeleton-containing epoxy resin | jER-4005P | — | — | — | 35 | 25 | 25 | — | 20 |
| | | Aliphatic hydrocarbon resin | Quintone 1500 | 10 | 10 | 10 | 10 | 10 | 10 | 10 | 10 |
| Curing agent | | Heat cationic initiator | CXC-1612 | 4 | 4 | 4 | 4 | 4 | 4 | 4 | 4 |
| Organic solvent | | Methyl ethyl ketone | — | 75 | 75 | 75 | 75 | 75 | 75 | 75 | 75 |
| Evaluation | Permittivity@100 kHz | | Evaluation [—] | Good 3.68 | Good 3.76 | Good 3.61 | Good 3.78 | Good 3.68 | Good 3.67 | Good 3.76 | Good 3.58 |
| | Haze | | Evaluation [%] | Fair 2.08 | Fair 2.36 | Good 0.35 | Good 0.70 | Good 0.65 | Good 0.84 | Fair 2.80 | Fair 1.50 |
| | Moisture permeability | | Evaluation [g/m²·24 h] | Good 44 | Good 41 | Good 40 | Good 35 | Good 36 | Good 34 | Good 34 | Good 36 |

TABLE 2-continued

| Formulation (unit: parts by mass) | | | Ex. 24 | Ex. 25 | Ex. 26 | Ex. 27 | Ex. 28 | Ex. 29 | Ex. 30 | Ex. 31 | Ex. 32 | Ex. 33 |
|---|---|---|---|---|---|---|---|---|---|---|---|---|
| Resin component | Biphenyl skeleton-containing epoxy resin | Biphenyl phenoxy resin | 20 | 35 | 25 | 25 | 25 | 20 | 25 | 25 | 30 | 30 |
| | | Biphenyl skeleton-containing epoxy resin ECH | — | — | — | — | — | — | — | — | — | — |
| | Alicyclic skeleton-containing epoxy resin | structure-containing epoxy resin | 35 | 15 | 25 | 30 | 30 | 30 | 25 | 30 | 30 | 30 |
| | Styrene oligomer | IPT homopolymer A | 15 | 15 | — | — | — | — | — | — | — | — |
| | | IPT homopolymer B | — | — | 15 | 15 | 10 | 15 | 10 | 15 | 15 | 5 |
| | | Copolymer of styrene and α-styrene | — | — | — | — | — | — | — | — | — | 5 |
| | Optional resin component | Bisphenol skeleton-containing epoxy resin (phenoxy type) | — | 25 | 25 | 20 | 20 | 25 | 25 | 20 | 25 | — |
| | | Bisphenol skeleton-containing epoxy resin | 20 | — | — | — | — | — | — | — | — | 20 |
| | | Aliphatic hydrocarbon resin | 10 | 10 | 10 | 10 | 15 | 10 | 15 | 10 | 10 | 15 |
| Curing agent | | Heat cationic initiator | 4 | 4 | 4 | 4 | 4 | 4 | 4 | 4 | 4 | 4 |
| Organic solvent | | Methyl ethyl ketone | 75 | 75 | 75 | 75 | 75 | 75 | 75 | 75 | 75 | 75 |
| Evaluation | Permittivity@100 kHz | | Good 3.57 | Good 3.72 | Good 3.60 | Good 3.58 | Good 3.59 | Good 3.60 | Good 3.62 | Good 3.57 | Good 3.56 | Good 3.56 |
| | Haze | | Good 0.85 | Fair 1.80 | Good 0.76 | Good 0.93 | Good 0.45 | Good 0.51 | Good 0.78 | Good 0.43 | Good 0.46 | Good 0.95 |
| | Moisture permeability | | Good 37 | Good 34 | Good 35 | Good 36 | Good 34 | Good 36 | Good 36 | Good 35 | Good 33 | Good 33 |

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

The image display device sealing material and the image display device sealing sheet of the present invention are suitably used as a sealing material for various image display devices; to be specific, they can be used as a sealing material for liquid crystal displays and organic EL displays.

DESCRIPTION OF REFERENCE NUMERALS 1 sealing sheet
2 sealing layer

The invention claimed is:

1. An image display device sealing material comprising:
a resin component and a curing agent, wherein
the resin component contains
biphenyl skeleton-containing epoxy resin having a weight-average molecular weight of 200 or more and 100,000 or less,
alicyclic skeleton-containing epoxy resin having a weight-average molecular weight of 180 or more and 790 or less, and
styrene oligomer having a weight-average molecular weight of 750 or more and 4000 or less.

2. The image display device sealing material according to claim 1, wherein
the resin component has a styrene oligomer content of 5 mass % or more and 25 mass % or less.

3. The image display device sealing material according to claim 1, wherein
the styrene oligomer includes a homopolymer of a styrene skeleton-containing monomer.

4. The image display device sealing material according to claim 1, wherein
the resin component further contains aliphatic hydrocarbon resin.

5. The image display device sealing material according to claim 4, wherein
the aliphatic hydrocarbon resin content relative to the styrene oligomer is 0.30 or more and 4.0 or less.

6. The image display device sealing material according to claim 4, wherein
the resin component has
an aliphatic hydrocarbon resin content of 20 mass % or less, and
a total of the styrene oligomer content and the aliphatic hydrocarbon resin content is 30 mass % or less.

7. An image display device sealing sheet composed of the image display device sealing material according to claim 1.

8. The image display device sealing sheet according to claim 7, wherein
the image display device is an organic EL display.

* * * * *